(12) United States Patent
Liao et al.

(10) Patent No.: US 12,230,672 B2
(45) Date of Patent: Feb. 18, 2025

(54) SUPER JUNCTION MOSFET DEVICE

(71) Applicant: CHINA RESOURCES MICROELECTRONICS (CHONGQING) CO., LTD, ChongQing (CN)

(72) Inventors: Tian Liao, ChongQing (CN); Rongyao Ma, ChongQing (CN); Daili Wang, ChongQing (CN); Pengcheng Zhang, ChongQing (CN); Jing Leng, ChongQing (CN); Zhongwang Liu, ChongQing (CN)

(73) Assignee: CHINA RESOURCES MICROELECTRONICS (CHONGQING) CO., LTD., ChongQing (CN)

( * ) Notice: Subject to any disclaimer, the term of this patent is extended or adjusted under 35 U.S.C. 154(b) by 0 days.

(21) Appl. No.: 18/275,614

(22) PCT Filed: Mar. 16, 2022

(86) PCT No.: PCT/CN2022/081143
§ 371 (c)(1),
(2) Date: Aug. 3, 2023

(87) PCT Pub. No.: WO2022/257529
PCT Pub. Date: Dec. 15, 2022

(65) Prior Publication Data
US 2024/0038837 A1    Feb. 1, 2024

(30) Foreign Application Priority Data
Jun. 7, 2021  (CN) .......................... 202110631921.8

(51) Int. Cl.
| | | |
|---|---|---|
| H01L 29/06 | (2006.01) | |
| H01L 29/10 | (2006.01) | |
| H01L 29/78 | (2006.01) | |

(52) U.S. Cl.
CPC ...... H01L 29/0634 (2013.01); H01L 29/1095 (2013.01); H01L 29/7802 (2013.01)

(58) Field of Classification Search
CPC .............. H01L 23/552; H01L 29/0615; H01L 29/0634; H01L 29/0684; H01L 29/1095;
(Continued)

(56) References Cited

U.S. PATENT DOCUMENTS

| | | | |
|---|---|---|---|
| 2007/0177444 A1* | 8/2007 | Miyajima | ........... H01L 29/0634 365/221 |
| 2008/0017897 A1* | 1/2008 | Saito | .................... H01L 29/7811 257/E29.136 |

(Continued)

FOREIGN PATENT DOCUMENTS

| | | | |
|---|---|---|---|
| CN | 101826554 A | * | 9/2010 |
| CN | 102412260 A | * | 4/2012 |

(Continued)

*Primary Examiner* — Fazli Erdem
(74) *Attorney, Agent, or Firm* — IPRTOP LLC

(57) ABSTRACT

A super junction MOSFET device, including: a substrate having a first conductive type; a buffer layer having the first conductive type and disposed on the substrate; a super junction structure disposed on the buffer layer and including multiple first conductive type pillars and multiple second conductive type pillars alternately arranged in a transverse direction, several second conductive type pillars being partially and/or wholly displaced to provide two or more different transverse dimensions for the first conductive type pillars; a body region having the second conductive type and disposed on a top of the second conductive type pillar; a source structure located within the body region and including a source region having the first conductive type and an (Continued)

ohmic contact region having the second conductive type which contacts with the source region; and a gate structure in contact with the first conductive type pillar and the source structure.

15 Claims, 7 Drawing Sheets

(58) Field of Classification Search
CPC ............ H01L 29/4236; H01L 29/7802; H01L 29/7813
USPC ........................................................ 257/329
See application file for complete search history.

(56) References Cited

U.S. PATENT DOCUMENTS

2019/0165161 A1* 5/2019 Arai .................... H01L 29/0634
2024/0038834 A1* 2/2024 Kimpara ............. H01L 29/7811

FOREIGN PATENT DOCUMENTS

| CN | 104465761 | A |   | 3/2015  |             |
|----|-----------|---|---|---------|-------------|
| CN | 107464837 | A |   | 12/2017 |             |
| CN | 106024859 | B | * | 6/2019  | H01L 29/0634 |
| CN | 111785625 | A |   | 10/2020 |             |
| CN | 112864219 | A |   | 5/2021  |             |

* cited by examiner the present application claims the benefit of priority to
Chinese Patent Application No. CN202110631921.8,
entitled "Super Junction MOSFET Device", filed with
CNIPA on Jun. 7, 2021, the contents of which are incorporated herein by reference in its entirety.

TECHNICAL FIELD

The present disclosure relates to the field of semiconductor devices, in particular, to a super junction MOSFET device.

BACKGROUND

Super junction Metal-Oxide-Semiconductor Field-Effect Transistors (MOSFETs) are proposed based on the charge balance theory. Compared with the conventional MOSFET device, a super junction MOSFET device introduces P-type pillars in the lightly doped drift region, and an N-type pillar and P-type pillar alternating structure is formed. In the withstand voltage state, the P-type pillar and N-type pillar deplete each other, so the drift region is similar to the intrinsic region, and the electric field in the drift region is optimized from the triangular distribution of the conventional MOSFET device to an approximate trapezoidal distribution, which improves the breakdown voltage (BV) of the device. Due to the ability of the P-type pillar of the super-junction MOSFET device to deplete the N-type pillar laterally, the doping concentration of the N-type pillar can be increased. At the same BV, the on-resistance (Ron) of the super-junction MOSFET device is proportional to $BV^{1.32}$, breaking the silicon limit and achieving a lower on-resistance.

However, in traditional super junction MOSFET devices, the width of the N-type pillar is fixed, so the depletion rate of the P-type pillar to the N-type pillar is the same in each cell. Compared to planar MOSFET devices, the depletion rate of the P-type pillar to the N-type pillar is very fast, making the junction capacitance of the super junction MOSFET device much smaller than that of the planar MOSFET device, resulting in a very fast switching speed. Although the fast switching speed can reduce the switching losses, too fast a switching speed can cause electromagnetic interference (EMI) problems in practical applications, limiting the application of super junction MOSFET devices. Therefore, how to improve the EMI of super junction MOSFET devices through the process and device structure has become an urgent problem.

SUMMARY

The present disclosure provides a new superjunction MOSFET device for solving the problem in the prior art such as susceptibility to electromagnetic interference caused by a fast switching speed due to the same depletion rate of the P-pillar to the N-pillar in each cell because of the fixed width of the N-pillar in traditional super junction MOSFET device.

The super junction MOSFET device includes:
a substrate having a first conductive type;
a buffer layer having the first conductive type and disposed on the substrate;
a super junction structure disposed on the buffer layer, the super junction structure including a plurality of first conductive type pillars and a plurality of second conductive type pillars alternately arranged in a transverse direction, each of the plurality of first conductive type pillars being adjacent to one of the plurality of second conductive type pillars, a second conductive type being different from the first conductive type; one or more of the plurality of second conductive type pillars are partially and/or wholly displaced to provide two or more different transverse dimensions for the plurality of first conductive type pillars;
a body region having the second conductive type and disposed on a top of one of the plurality of second conductive type pillars;
a source structure located within the body region, the source structure including a source region having the first conductive type and an ohmic contact region having the second conductive type, the ohmic contact region being in contact with the source region; and
a gate structure in contact with one of the plurality of first conductive type pillars and the source structure.

Optionally, lower portions of one or more of the plurality of second conductive type pillars are displaced by different distances in a same direction.

Optionally, lower portions of one or more of the plurality of second conductive type pillars are displaced by the same distance in a same direction.

Optionally, upper portions of one or more of the plurality of second conductive type pillars are displaced by different distances in a same direction.

Optionally, upper portions of one or more of the plurality of second conductive type pillars are displaced by the same distance in a same direction.

Optionally, two or more of the plurality of second conductive type pillars are wholly displaced by different distances in a same direction.

Optionally, two or more of the plurality of second conductive type pillars are wholly displaced by the same distance in a same direction.

As an example, the gate structure includes any one of a planar gate and a trench gate.

As an example, the super junction structure is formed by a trenching process or multiple epitaxy processes.

As an example, a material of the substrate includes one or more of silicon, germanium, germanium-silicon, silicon on insulator, and silicon carbide.

As an example, each of the second conductive type pillars is displaced by a distance of no more than one cell to maintain a charge balance state within each cell.

As an example, the first conductive type is N-type, and the second conductive type is P-type.

As an example, the super junction MOSFET device further includes a source metal layer and a drain metal layer, where the source metal layer is in contact with the source structure and extends above the gate structure, and the drain metal layer is disposed on a surface of the substrate away from the buffer layer.

As an example, the body region, the source structure, and the gate structure are displaced in a same direction and by a same distance along with the one of the second conductive type pillars the top of which the body region is disposed on.

As described above, the super junction MOSFET device of the present disclosure has the following beneficial effects: the improved structural design in the present disclosure allows a part or the entirety of each of several second conductive type pillars to be displaced to provide two or more different transverse dimensions for the first conductive type pillars. The different spacings between the second conductive type pillars result in different lateral depletion rates, with wider spacing resulting in slower depletion rates and a more gradual decline in capacitance. This can reduce the dramatic voltage changes during switching and effectively mitigate electromagnetic interference and other issues when the device is in use.

DESCRIPTION OF REFERENCE NUMERALS

Figure 1:
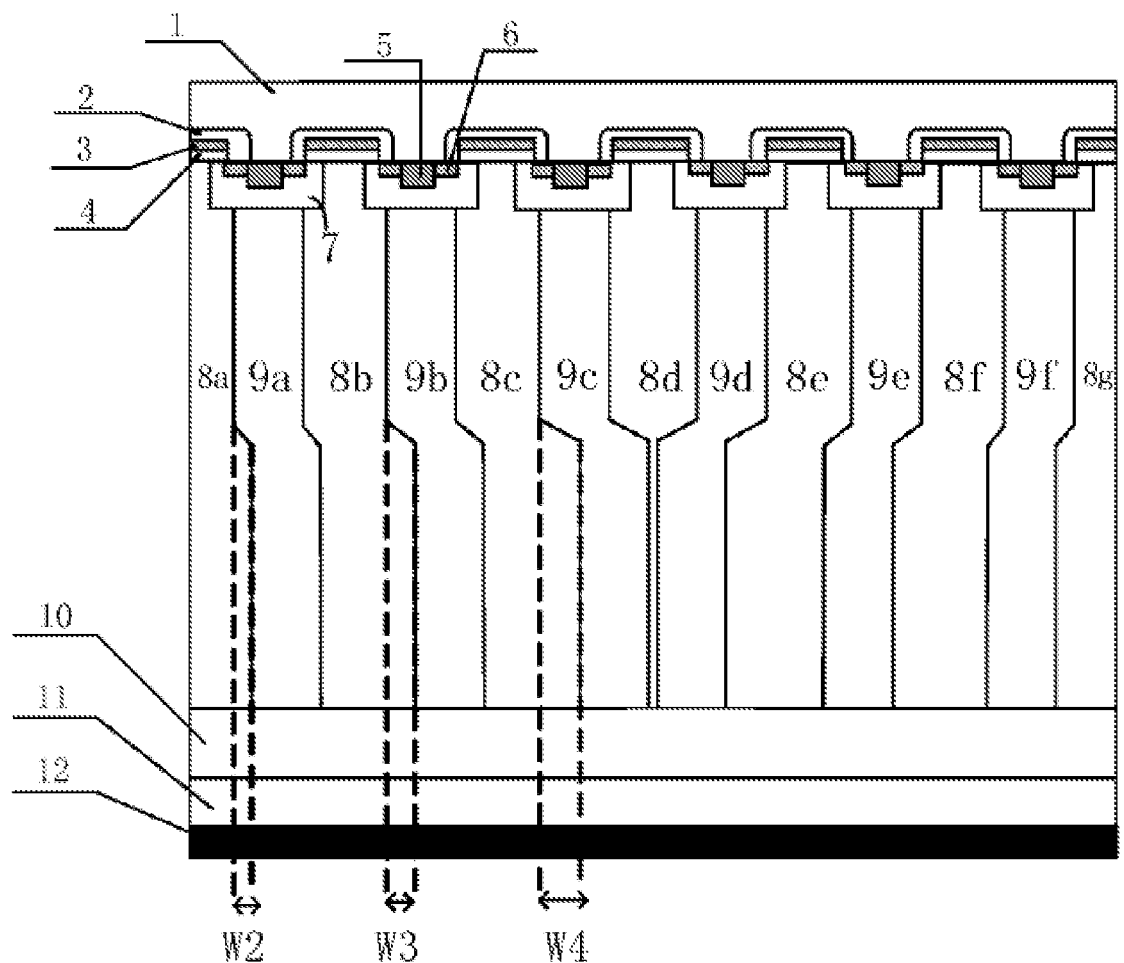
FIGS. 1-6 show cross-sectional structural views of a super junction MOSFET device according to various embodiments of the present disclosure.

1 Source metal layer
2 Gate dielectric layer
3 Gate conductive layer
4 Gate oxide layer
5 Ohmic contact region
6 Source region
7 Body region
8a-8g N-type pillar
9a-9f P-type pillar
10 Buffer layer
11 Substrate
12 Drain metal layer

DETAILED DESCRIPTION

The embodiments of the present disclosure will be described below through exemplary embodiments. Those skilled in the art can easily understand other advantages and effects of the present disclosure according to contents disclosed by the specification. The present disclosure can also be implemented or applied through other different exemplary embodiments. Various modifications or changes can also be made to all details in the specification based on different points of view and applications without departing from the spirit of the present disclosure. In the detailed description of examples of the disclosure, for the purpose of illustration, the cross-sectional view indicating the structure of the device will not be partially enlarged according to the general scale, and the schematic views are only examples, which do not intend to limit the protection scope the present disclosure. In addition, in the actual production, the three-dimensional space dimensions including the length, width and depth of the device should be included.

For the purpose of illustration, spatial relationship terms such as "below", "under", "lower", "down", "above", "on", etc. may be used to describe the relationship of an element or feature to other elements or features shown in the accompanying drawings. It will be understood that these spatial relationship terms are intended to encompass directions of the device in use or operation other than those depicted in the accompanying drawings. In addition, when a layer is referred to as being "between" two layers, it may be the only layer between the two layers, or there may be one or more additional layers between the two layers.

In the context of the present disclosure, the structure described with the first feature "on" the second feature may include embodiments where the first and second features are in direct contact, or it may include embodiments where additional features are formed between the first and second features such that the first and second features may not be in direct contact.

It needs to be stated that the drawings provided in the following embodiments are just used for schematically describing the basic concept of the present disclosure, thus illustrating components related to the present disclosure and are not drawn according to the numbers, shapes and sizes of components during actual implementation. The configuration, number and scale of each component during actual implementation thereof may be freely changed, and the component layout configuration thereof may be more complex. In order to keep the drawings as simple as possible, not all structures are fully labeled in each accompanying figure.

In traditional super junction MOSFET devices, the width of the N-type pillar is fixed, so the depletion rate of the P-pillar to the N-type pillar is the same in each cell. Compared to planar MOSFET devices, the depletion rate of the P-type pillar to the N-type pillar is very fast, making the junction capacitance of the super junction MOSFET device much smaller than that of the planar MOSFET device, resulting in a very fast switching speed. However, too fast a switching speed can cause electromagnetic interference (EMI) problems in practical applications. To address this issue, the present disclosure provides an improved solution.

Specifically, as shown in FIGS. 1 to 6, the present disclosure provides a super junction MOSFET device. The super junction MOSFET device includes:
  a substrate 11 having a first conductive type;
  a buffer layer 10 having the first conductive type and disposed on the substrate 11;
  a super junction structure disposed on the buffer layer 10, where the super junction structure includes multiple first conductive type pillars and multiple second conductive type pillars alternately spaced along a transverse direction, that is, each of the first conductive type pillars is adjacent to one of the second conductive type pillars; the second conductive type is different from the first conductive type; a part and/or the entirety of each of several (including one or at least two) second conductive type pillars is displaced to provide two or more different transverse dimensions for the first conductive type pillar, for example by partially displacing one or more than two second conductive type pillars to provide multiple different transverse dimensions for the same first conductive type pillar, and/or by wholly displacing two or more second conductive type pillars (but when all the second conductive type pillars are wholly displaced, the displacement distances are not all the same or are all different) to provide different transverse dimensions for multiple different first conductive type pillars;
  a body region 7 having the second conductive type and disposed on a top of each second conductive type pillar;
  a source structure located within the body region 7, the source structure including a source region 6 having the first conductive type and an ohmic contact region 5 having the second conductive type, the ohmic contact region 5 being in contact with the source region 6; and
  a gate structure in contact with one of the first conductive type pillars and the source structure.

The improved structural design of the present disclosure causes several second conductive type pillars to partially and/or wholly shift to provide two or more different transverse dimensions for the first conductive type pillar. The different spacings between the second conductive type pillars result in different transverse depletion rates, with wider spacing resulting in slower depletion rates and a more gradual decline in capacitance slope, which can reduce the dramatic voltage changes during switching and effectively alleviate electromagnetic interference and other issues in device application.

In this embodiment, as an example, the first conductive type is N-type and the second conductive type is P-type, so the first conductive type pillar is an N-type pillar and the second conductive type pillar is a P-type pillar. Accordingly, the body region 7 is a lightly doped P-type region, the source region 6 is a heavily doped N-type region, and the ohmic contact region 5 is a heavily doped P-type region. In other examples, the first conductive type may be P-type and the second conductive type may be N-type. The present specification will focus on describing in detail the case where the first conductive type pillar is an N-type pillar and the second conductive type pillar is a P-type pillar. The super junction structure can be formed by a trenching process, for example, a first N-type doped layer is formed on the buffer layer 10, then the first N-type doped layer is photolithographically etched to form multiple spaced trenches, and then corresponding trenches are filled with P-type material using a vapor deposition process to form lower portions of N-type pillars and P-type pillars; afterwards, a second N-doped layer is formed on the first N-doped layer, and then the upper portions of the N-type pillars and P-type pillars are formed by photolithography etching and a vapor deposition process, thereby forming the super junction structure. In other examples, the super junction structure can also be formed by multiple epitaxy processes, which will not be described in detail.

As an example, the substrate 11 includes, but is not limited to, one or more of semiconductor substrates such as silicon, germanium, germanium-silicon, silicon on insulator, and silicon carbide. The buffer layer 10 may be formed on the substrate 11 by an ion implantation process and/or a chemical vapor deposition process. The formation of the buffer layer 10 helps to prevent the diffusion of ions from the super junction structure into the substrate 11, thereby ensuring the breakdown voltage resistance of the device.

As an example, the gate structure includes any one of a planar gate and a trench gate. In the drawings attached to the present specification, a planar gate is used as an example. The planar gate is disposed on a top of the first conductive type pillar and extends over the body region 7 and the source region 6. The planar gate includes a gate oxide layer 4, a gate conductive layer 3 disposed on a top of the gate oxide 4, and a gate dielectric layer 2 disposed on a top of the gate conductive layer 3. The gate oxide layer 4 includes but is not limited to silicon oxide and can be formed by a thermal oxidation process; the gate conductive layer 3 includes but is not limited to a polycrystalline silicon layer, and the gate dielectric layer 2 includes but is not limited to a silicon nitride layer. The process for forming the gate conductive layer 3 and the gate dielectric layer 2 includes but is not limited to a chemical vapor deposition process. When the gate structure is a trench gate, the gate oxide layer and the gate conductive layer can be formed in a trench located within the first conductive type pillar and exposed on the surface of the first conductive type pillar, and are in contact with the source region 6 and the body region 7, while the gate dielectric layer is located on the surface of the gate oxide layer and the gate conductive layer.

The super junction MOSFET device further includes a source metal layer 1 and a drain metal layer 12. In an example, the source metal layer 1 is disposed on a surface of the ohmic contact region 5 and source region 6 and is in contact with the ohmic contact region 5 and extends above the gate structure (i.e., covers the gate structure), and the drain metal layer 12 is disposed on a surface of the substrate 11 away from the buffer layer 10. The source metal layer 1 includes, but is not limited to, an aluminum layer, and the drain metal layer 12 includes, but is not limited to, one or more of a titanium layer, a nickel layer, and a silver layer. In other examples, the source metal layer 1 and drain metal layer 12 may be arranged in other ways, which are not strictly limited. The super junction MOSFET device may further include a lead-out electrode electrically connected to the source metal layer and drain metal layer.

As an example, the second conductive type pillar is displaced by a distance of no more than one cell to maintain a state of charge balance within each cell; where the cell refers to the smallest repeating unit of the active region of the device.

The present disclosure is further described below in conjunction with the accompanying drawings.

As shown in FIG. 1, the superjunction structure of the superjunction MOSFET device in this example includes alternating N-type pillars (8a,8b,8c,8d,8e,8f,8g) and P-type pillars (9a,9b,9c,9d,9e,9f), with the lower portions of a number of the second conductive type pillars (e.g., two or more P-type pillars) displaced by different distances in the same direction (when a lower portion of only one second conductive type pillar is displaced, it can be considered that the displacements of the lower portions of other second conductive type pillars are zero). Refer to FIG. 1, it can be seen that in the left half of the cell, the lower portions of P-type pillars 9a, 9b, 9c are displaced to the right by distances W2, W3 and W4, respectively, with the center of the cell (super junction structure) as the reference point, where W2, W3 and W4 are all different with each other or not identical.

Figure 2:
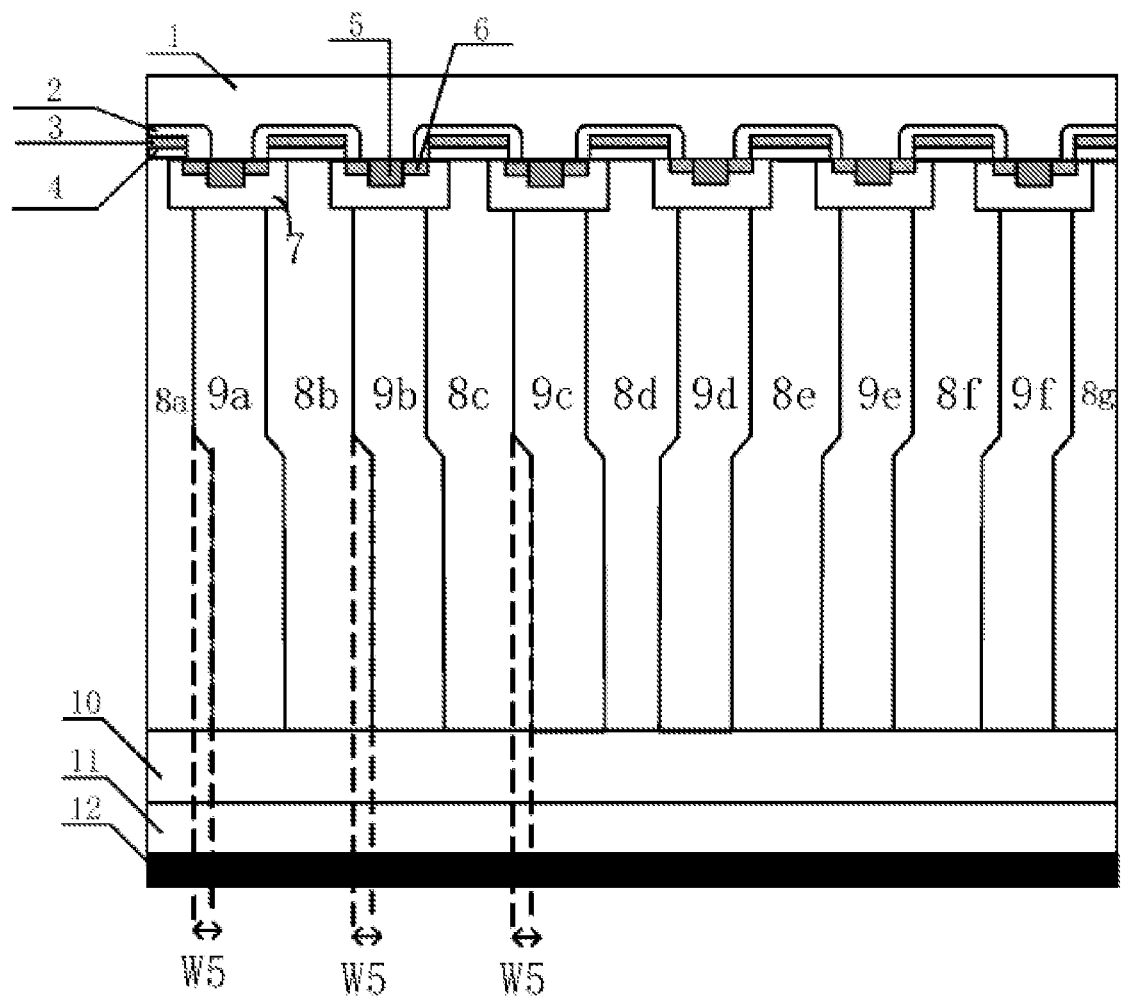

In another example, the lower portions of a number of the second conductive type pillars (e.g., two or more P-type pillars) are displaced by the same distance in the same direction. For example, as shown in FIG. 2, in the left half of the cell, the lower portions of P-type pillars 9a, 9b, and 9c are all displaced to the right by a distance of W5.

Figure 3:
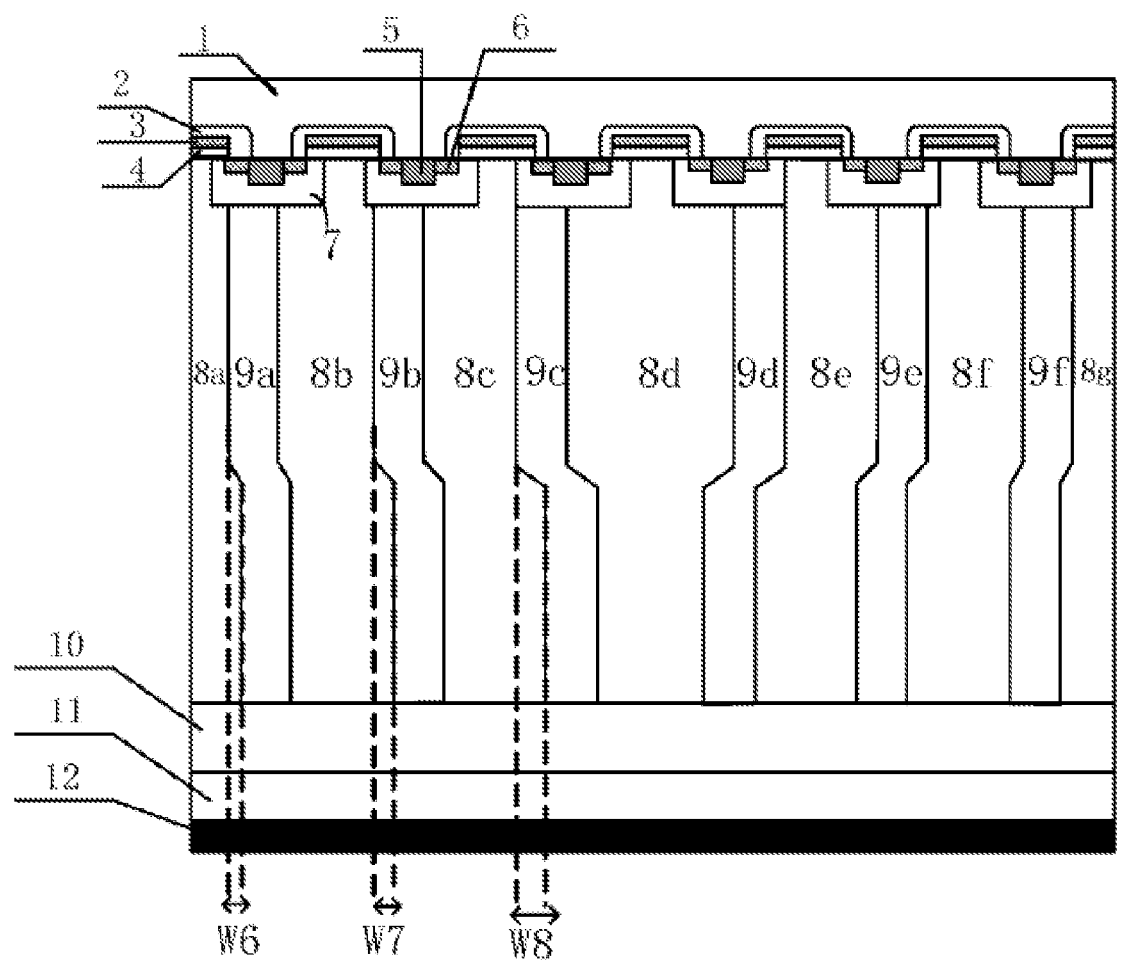

In yet another example, the upper portions of a number of the second conductive type pillars (e.g., a single or two or more P-type pillars) are displaced by different distances in the same direction. Refer to FIG. 3, it can be seen that in the left half of the cell, the upper portions of the P-type pillars 9a, 9b, 9c are displaced to the left by distances W6, W7, W8, respectively, where W6, W7, W8 are all different with each other or not identical.

Figure 4:
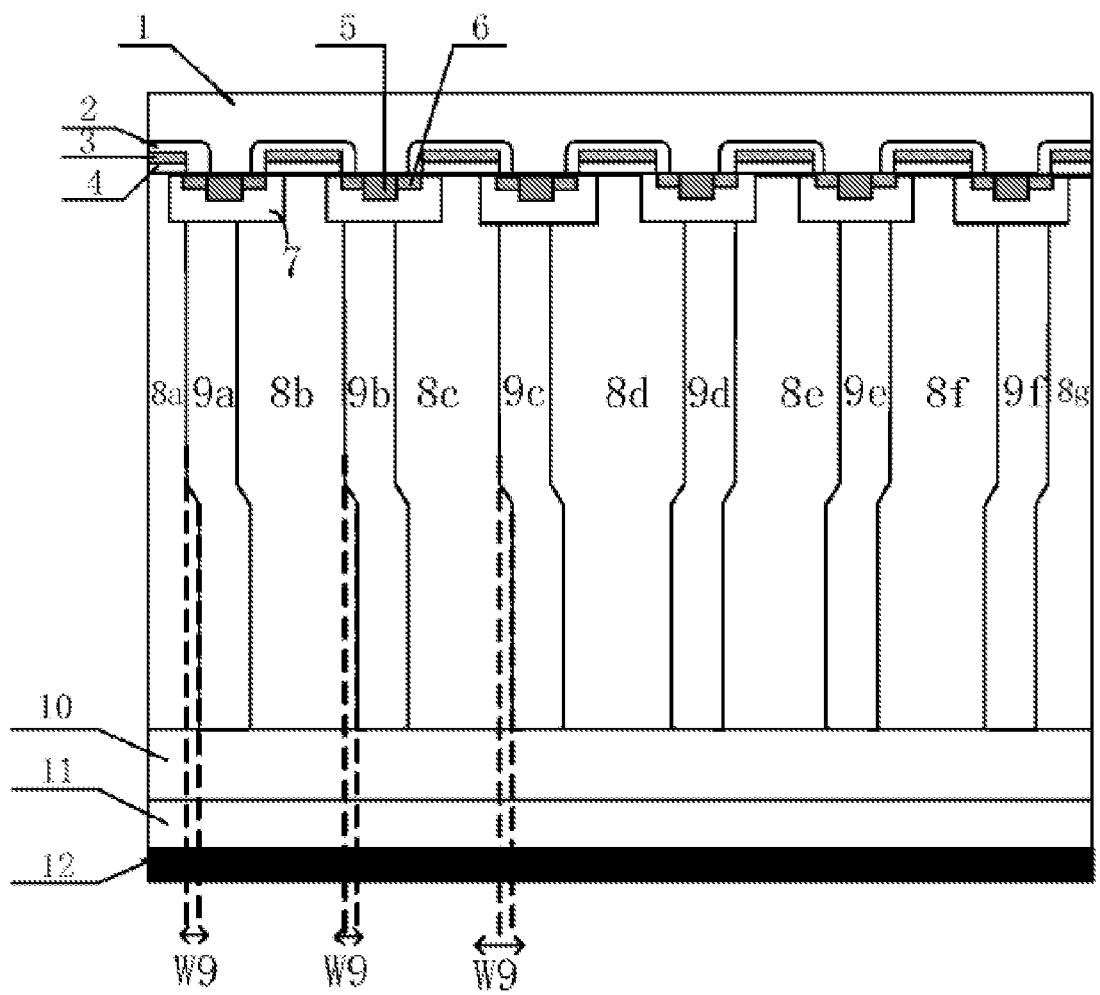

In yet another example, the upper portions of a number of the second conductive type pillars (e.g., two or more P-type pillars) are displaced by the same distance in the same direction. For example, as shown in FIG. 4, in the left half of the cell, the upper portions of P-type pillars 9a, 9b, 9c are all displaced by a distance W9 to the left.

Figure 5:
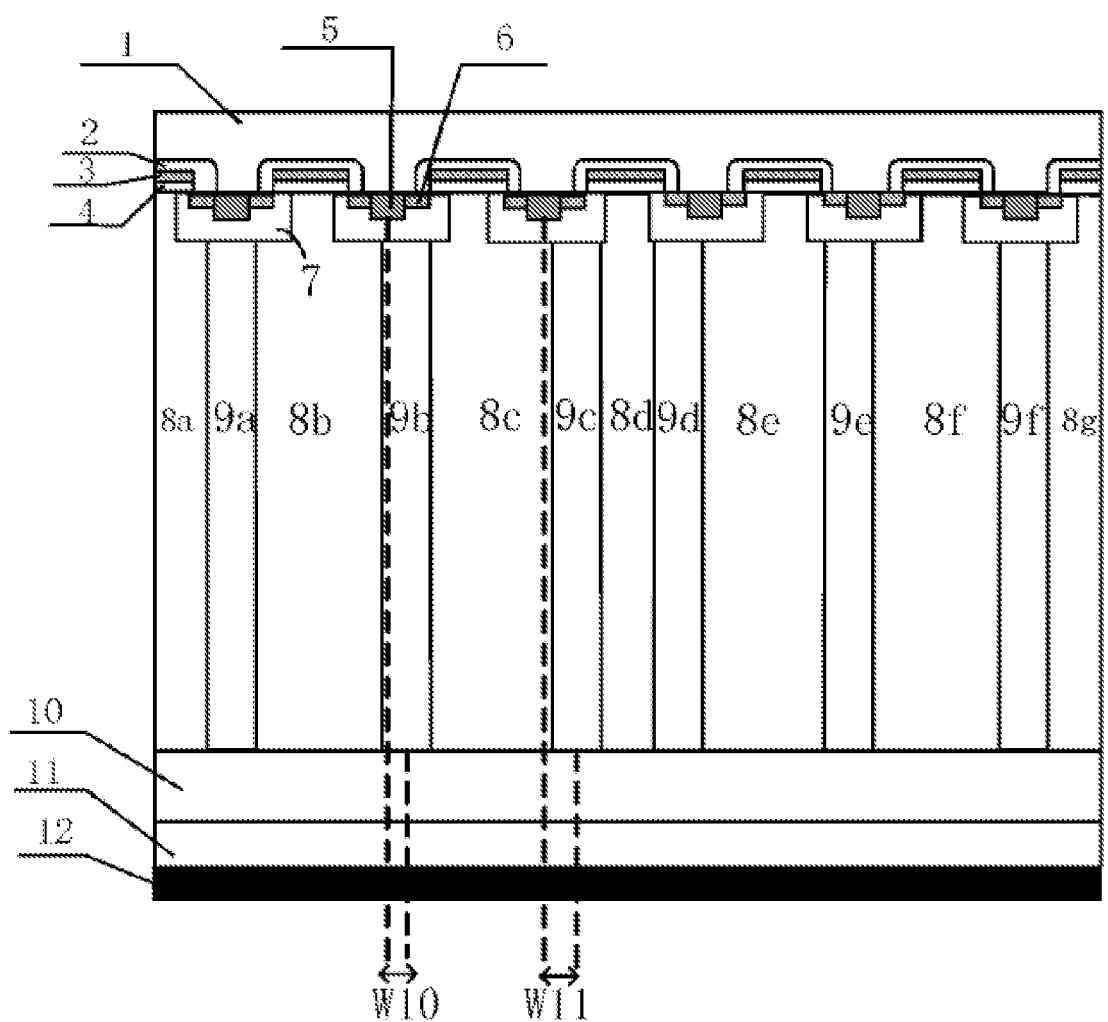

In yet another example, several second conductive type pillars (e.g., a single or two or more P-type pillars) each are displaced as a whole and are displaced by different distances in the same direction. For example, as shown in FIG. 5, the entirety of the P-type pillar 9b is displaced to the right by a distance W10, and the entirety of the P-type pillar 9c is displaced to the right by a distance W11, where W10 and W11 are different.

Figure 6:
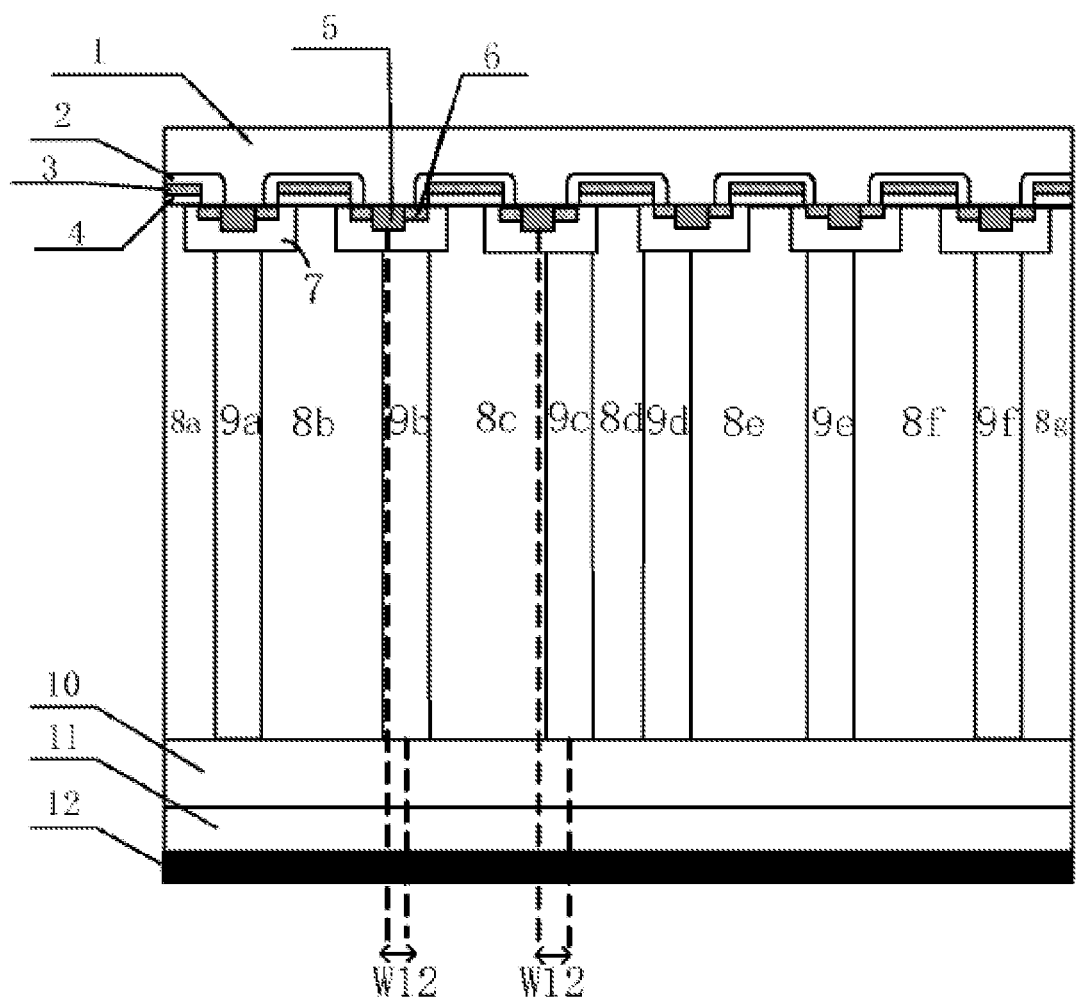

In yet another example, several second conductive type pillars (e.g., a single or two or more P-type pillars, but not all of them) each are displaced as a whole and are displaced by the same distance in the same direction. As shown in FIG. 6, in this embodiment, the entirety of each of the P-type pillars 9a, 9b, 9c are all displaced to the right by a distance of W12.

In other examples, the body region 7, the source structure and the gate structure can be moved in the same direction and the same distance with the second conductive type pillar, more precisely with the upper portion of the second conductive type pillar, to ensure that the connection between the structures remains unchanged.

In particular, the "upper portion" and the "lower portion" may be two parts divided by the midpoint of the height of the second conductive type pillar, but this is not limited. The "upper portion" and the "lower portion" may also be two parts divided by other proportions of the height of the second conductive type pillar. In other examples, it is also possible to divide a single second conductive type pillar into three parts (i.e., upper, middle and lower parts), or into four and more parts, each of which may be displaced by the same or different distances to give the first conductive type pillar multiple different lateral dimensions, without being strictly limited in this regard. However, from the point of view of the process, it is preferred to divide the second conductive type pillar into upper and lower parts for partial displacement or to wholly displace several second conductive type pillars.

Figure 7:
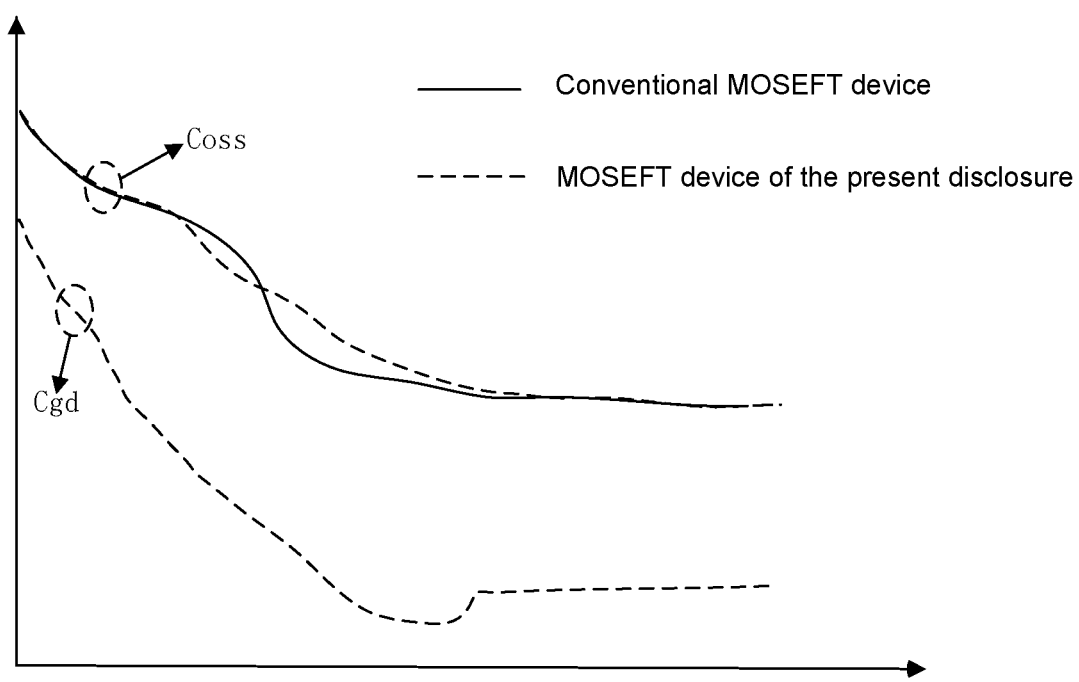
FIG. 7 shows a comparison of simulation capacitance curves between a super junction MOSFET device of the present disclosure and a traditional super junction MOSFET device.

The inventors have verified and compared the performance of a conventional super junction MOSFET device having N pillars of a single width with that of the super junction MOSFET device of the present disclosure, and FIG. 7 shows the simulated capacitance curve of the super junction MOSFET device of the present disclosure compared with that of the conventional super junction MOSFET device. It can be seen that the descending slope of the output capacitance curve and the reverse transfer capacitance curve of the super junction MOSFET device of the present disclosure is slower than that of the conventional super junction MOSFET device, which indicates that the super junction MOSFET device of the present disclosure can mitigate the electromagnetic interference (EMI) problem of the device during application.

In summary, the present disclosure provides a superjunction MOSFET device. The super junction MOSFET device includes: a substrate having a first conductive type; a buffer layer having the first conductive type and disposed on the substrate; a super junction structure disposed on the buffer layer and including multiple first conductive type pillars and multiple second conductive type pillars alternately arranged in a transverse direction, each of first conductive type pillars being adjacent to one of the second conductive type pillars, and the second conductive type being different from the first conductive type, one or more of the second conductive type pillars being partially and/or wholly displaced to provide two or more different transverse dimensions for the first conductive type pillars; a body region having the second conductive type and disposed on a top of one of the second conductive type pillars; a source structure located within the body region and including a source region having the first conductive type and an ohmic contact region having the second conductive type, the ohmic contact region being in contact with the source region; and a gate structure in contact with one of the first conductive type pillars and the source structure. The improved structural design in the present disclosure allows a part or the entirety of each of several second conductive type pillars to be displaced to provide two or more different transverse dimensions for the first conductive type pillars. The different spacings between the second conductive type pillars result in different lateral depletion rates, with wider spacing resulting in slower depletion rates and a more gradual decline in capacitance. This can reduce the dramatic voltage changes during switching and effectively mitigate electromagnetic interference and other issues when the device is in use. Therefore, the present disclosure effectively overcomes various disadvantages of existing technology and has high industrial value.

The above-mentioned embodiments are just used for exemplarily describing the principle and effects of the present disclosure instead of limiting the present disclosure. Those skilled in the art can make modifications or changes to the above-mentioned embodiments without going against the spirit and the range of the present disclosure. Therefore, all equivalent modifications or changes made by those who have common knowledge in the art without departing from the spirit and technical concept disclosed by the present disclosure shall be still covered by the claims of the present disclosure.

The invention claimed is:

1. A super junction MOSFET device, comprising:
a substrate having a first conductive type;
a buffer layer having the first conductive type and disposed on the substrate;
a super junction structure disposed on the buffer layer,
wherein the super junction structure comprises a plurality of first conductive type pillars and a plurality of second conductive type pillars alternately arranged in a transverse direction,
wherein each of the plurality of first conductive type pillars is adjacent to one of the plurality of second conductive type pillars, wherein a second conductive type is different from the first conductive type;
wherein lower portions of a first subset of the plurality of second conductive type pillars are shifted in a first direction for a first width, and lower portions of a second subset of the plurality of second conductive type pillars are shifted in the first direction for a second width; wherein the first width is different from the second width;
a body region having the second conductive type and disposed on a top of one of the plurality of second conductive type pillars;
a source structure located within the body region, wherein the source structure comprises a source region having the first conductive type and an ohmic contact region having the second conductive type, wherein the ohmic contact region is in contact with the source region; and
a gate structure in contact with one of the plurality of first conductive type pillars and the source structure.

2. The super junction MOSFET device according to claim 1, wherein the gate structure comprises any one of a planar gate and a trench gate, wherein a material of the substrate comprises one or more of silicon, germanium, germanium-silicon, silicon on insulator, and silicon carbide.

3. The super junction MOSFET device according to claim 2, wherein the gate structure is a planar gate disposed on a top of one of the plurality of second conductive type pillars and extending above the body region and the source region; wherein the planar gate comprises a gate oxide layer, a gate conductive layer disposed on a top of the gate oxide layer, and a gate dielectric layer disposed on a top of the gate conductive layer.

4. The super junction MOSFET device according to claim 2, wherein the gate structure is a trench gate comprising a gate oxide layer, a gate conductive layer, and a gate dielectric layer, wherein the gate oxide layer and the gate conductive layer are formed in a trench located within the first conductive type pillar and are exposed on a surface of the first conductive type pillar and are in contact with the source region and the body region, and the gate dielectric layer is disposed on a surface of the gate oxide layer and the gate conductive layer.

5. The super junction MOSFET device according to claim 1, wherein the super junction structure is formed by a trenching process or multiple epitaxy processes.

6. The super junction MOSFET device according to claim 1, wherein the first conductive type is N-type and the second conductive type is P-type.

7. The super junction MOSFET device according to claim 1, wherein each of the plurality of second conductive type pillars is shifted by a distance of no more than one cell to maintain a charge balance state within each cell.

8. The super junction MOSFET device according to claim 1, further comprising a source metal layer and a drain metal layer, wherein the source metal layer is in contact with the source structure and extending above the gate structure, and the drain metal layer is disposed on a surface of the substrate away from the buffer layer.

9. The super junction MOSFET device according claim 1, wherein the body region, the source structure, and the gate structure are shifted by a same distance and in a same direction along with the one of the plurality of second conductive type pillars.

10. The super junction MOSFET device according claim 1, wherein lower portions of a third subset of the plurality of second conductive type pillars are shifted in the first direction for a third width, and the third width is different from both the first width and the second width.

11. The super junction MOSFET device according claim 3, wherein the gate oxide layer is formed by thermal oxidation.

12. The super junction MOSFET device according claim 1, wherein the super junction MOSFET device comprises multiple body regions, each of which is disposed on top of a respective one of the plurality of second conductive type pillars, and is shifted by a same distance and in a same direction along with the respective one of the plurality of second conductive type pillars.

13. The super junction MOSFET device according claim 1, wherein the lower portions and the upper portions of the plurality of second conductive type pillars are separated by midpoints of the plurality of second conductive type pillars.

14. The super junction MOSFET device according claim 1, wherein each of the plurality of second conductive type pillars is divided into three parts, and the three parts of each of the plurality of second conductive type pillars are shifted by different distances.

15. The super junction MOSFET device according claim 1, wherein the first direction is a transverse direction.

* * * * *